United States Patent [19]

Schwalm et al.

[11] Patent Number: 5,300,400

[45] Date of Patent: Apr. 5, 1994

[54] PROCESS FOR THE PRODUCTION OF RELIEF PATTERNS AND IMAGES UTILIZING AN ORGANIC COMPOUND HAVING AT LEAST ONE ACID-CLEAVABLE GROUP AND A STORAGE STABILITY IMPROVING AMOUNT OF A SECOND ORGANIC COMPOUND

[75] Inventors: Reinhold Schwalm, Wachenheim; Horst Binder, Lampertheim, both of Fed. Rep. of Germany

[73] Assignee: BASF Aktiengesellschaft, Ludwigshafen, Fed. Rep. of Germany

[21] Appl. No.: 91,089

[22] Filed: Jul. 14, 1993

Related U.S. Application Data

[62] Division of Ser. No. 769,437, Oct. 1, 1991, abandoned.

[30] Foreign Application Priority Data

Oct. 10, 1990 [DE] Fed. Rep. of Germany ........ 4032162

[51] Int. Cl.$^5$ ................................. G03F 7/30
[52] U.S. Cl. .................................. 430/306; 430/326; 430/330
[58] Field of Search ................. 430/326, 330, 306

[56] References Cited

U.S. PATENT DOCUMENTS

| | | |
|---|---|---|
| 3,779,778 | 12/1973 | Smith et al. |
| 3,915,706 | 10/1975 | Limburg et al. |
| 3,923,514 | 12/1975 | Marsh |
| 4,101,323 | 7/1978 | Buhr et al. |
| 4,678,737 | 7/1987 | Schneller et al. ............ 430/270 |
| 4,883,740 | 11/1989 | Schwalm et al. ............ 430/270 |
| 4,889,788 | 12/1989 | Stahlhofen et al. .......... 430/191 |
| 4,963,463 | 10/1990 | Koshiba et al. .............. 430/191 |
| 5,069,998 | 12/1991 | Schwalm et al. ............ 430/270 |

OTHER PUBLICATIONS

Photoinitiated Cationic Polymerization by Dialkyl-4-Hydroxyphenylsulfonium Salts. Journal of Polymer Science, vol. 18, 1021–1034 (1980).

*Primary Examiner*—Charles L. Bowers, Jr.
*Assistant Examiner*—Christopher G. Young
*Attorney, Agent, or Firm*—Keil & Weinkauf

[57] ABSTRACT

A radiation-sensitive mixture suitable for producing relief patterns comprises
(a) a water-insoluble but alkali-soluble polymeric binder,
(b) an organic compound whose solubility in an alkaline developer is increased by the action of acid and which contains at least one acid-cleavable group and additionally a group which forms a strong acid on irradiation, and additionally
(c) an organic compound which reacts with water or stronger nucleophiles at up to 120° C.

11 Claims, No Drawings

PROCESS FOR THE PRODUCTION OF RELIEF PATTERNS AND IMAGES UTILIZING AN ORGANIC COMPOUND HAVING AT LEAST ONE ACID-CLEAVABLE GROUP AND A STORAGE STABILITY IMPROVING AMOUNT OF A SECOND ORGANIC COMPOUND

This application is a continuation of application Ser. No. 07/769,437, filed on Oct. 1, 1991, now abandoned.

The present invention relates to positive-working radiation-sensitive mixtures comprising an alkali-soluble binder, a compound which contains at least one acid-cleavable bond and forms a strong acid on irradiation, increasing the solubility of the compound in an alkaline solvent by the action of the acid, and further compounds. These mixtures are sensitive to UV light, electron beams and X-rays and are suitable for use in particular as resist materials.

Positive-working radiation-sensitive mixtures are known. Positive-working resist materials which contain o-quinonediazides in alkali-soluble binders, e.g. novolaks, are used as photoresists, so that the processes for producing relief images are also known. However, the sensitivity of these systems to radiation is in some instances unsatisfactory.

Radiation-sensitive systems have therefore been developed which in the primary photoreaction create a species which independently of the radiation then initiates a secondary, catalytic reaction and thereby dramatically increases the sensitivity. Such systems where the photochemically created species is a strong acid which in a secondary reaction then cleaves acid-labile groups are known for example from U.S. Pat. No. 3,923,514, U.S. Pat. No. 3,915,706 and DE-A-34 06 927.

Furthermore, DE-A-37 21 741 proposes radiation-sensitive mixtures which contain an alkali-soluble polymeric binder and an organic compound whose solubility in an alkali developer is increased by the action of acid and which contains at least one acid-cleavable group, said organic compound forming a strong acid on irradiation.

A disadvantage of these systems is their sensitivity to contaminants which deactivate the photochemically produced catalyst. Such deactivation reactions play a particularly important part in the period of storage between the exposure step and the usually heat-assisted subsequent step of the secondary reaction leading to the elimination of the acid-labile groups in that complete development is no longer possible: coating residues or residual layers are left behind on the wafer.

It is an object of the present invention to delineate radiation-sensitive mixtures with which photoresist materials which are based on an acid-catalyzed reaction mechanism, in particular light-sensitive positive-working materials comprising an alkali-soluble binder and an organic compound which contains at least one acid-cleavable bond and a group which forms a strong acid on irradiation, can be made into relief patterns with a realistic processing latitude, in particular in respect of storage times between exposure and heating or baking, while avoiding the leaving of residual layers on the wafer.

We have found that this object is achieved very advantageously by the mixtures of the present invention.

The present invention accordingly provides a radiation-sensitive mixture comprising (a) a water-insoluble but alkali-soluble polymeric binder and
(b) an organic compound whose solubility in aqueous alkali is increased by the action of an acid and which contains at least one acid-cleavable group and additionally a group which forms a strong acid on irradiation, additionally containing
(c) at least one organic compound which reacts with water or stronger nucleophiles at up to 120° C., if necessary even in the presence of an acid catalyst.

The preferred radiation-sensitive mixtures contain polymeric binders (a) based on homopolymers or copolymers of p-hydroxystyrene and/or p-hydroxy-α-methylstyrene. Especially suitable hydroxystyrenes are mono- or disubstituted in the o-position or have the phenolic group protected by acid-labile groups.

Preferred organic compounds (b) are sulfonium salts of the formula (I)

where $R^1$, $R^2$ and $R^3$ are identical or different and each is an aliphatic or aromatic radical which may contain hetero atoms or two of $R^1$ to $R^3$ form a ring, with the proviso that at least one of $R^1$ to $R^3$ contains at least one acid-cleavable group, while one of $R^1$ to $R^3$ can be linked to one or more further sulfonium salt radicals, where appropriate via an acid-cleavable group, and $X^\ominus$ is a non-nucleophilic counter-ion.

A suitable organic compound (c) is basically any known organic compound which reacts with water or stronger nucleophiles, for example by hydrolysis, ammonolysis, aminolysis or addition of water or nucleophile. Preference, however, is given to those compounds whose rate of reaction with any nucleophile or water which is present in the layer or has entered during any storage periods is higher than that of the photochemically produced acid catalyst and where the reverse reaction, re-releasing the nucleophile or water, takes place only to a minor extent, if at all, under the processing conditions.

The present invention also provides a process for producing relief patterns and images by using a radiation-sensitive mixture of the present invention which, after irradiation, is preferably heated to 60°–120° C.

The radiation-sensitive mixtures of the present invention make it possible to produce relief patterns and images of high resolution under realistic processing conditions with a sufficiently generous processing latitude, in particular with acceptable storage times (>10 minutes) between irradiation and baking.

Furthermore, the sensitivity of the systems is very high, owing to the catalytic effect of the photochemically produced acid, and they give very high contrast values. These radiation-sensitive mixtures are therefore very highly suitable for use in deep UV lithography.

The formative components of the radiation-sensitive mixture of the present invention will now be discussed in detail.

(a) The polymeric binder (a) consists essentially of polymers based on homopolymers or copolymers of p-hydroxystyrene and/or p-hydroxy-α-methylstyrene. Especially suitable hydroxystyrenes are mono- or disubstituted in o-position or have the phenolic group protected by acid-labile groups, suitable substituents for the o-position relative to the phenolic OH group being halogens and in particular alkyl groups of from 1 to 4 carbon atoms. Particularly preferred acid-labile groups here are t-butyl carbonates, t-amyl carbonates and t-butyl esters. The polymers generally have average molecular weights $\overline{M}_w$ within the range from 2000 to 100,000, preferably from 10,000 to 30,000.

The polymeric binder (a) is in general present in the mixture of the present invention in an amount of from 55 to 98, preferably from 70 to 96, % by weight, based on the sum total of components (a) to (c).

(b) Particularly preferred organic compounds (b) are those of the formula (I)

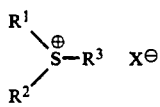
(I)

where $R^1$, $R^2$ and $R^3$ are identical or different and each is an aliphatic or aromatic radical which may contain hetero atoms or two of $R^1$ to $R^3$ form a ring, with the proviso that at least one of $R^1$ to $R^3$ contains at least one acid-cleavable group, preferably a t-butyl carbonate of a phenol or a silyl ether of a phenol, while one of $R^1$ to $R^3$ can be linked to one or more further sulfonium salt radicals, in particular via an acid-cleavable group, and $X^\ominus$ a is a non-nucleophilic counter-ion.

Preferred counter-ions are complex metal halides, such as tetrafluoroborate, hexafluoroantimonate and hexafluoroarsenate, and strong organic acid anions such as trifluoromethanesulfonate and fluorosulfonate.

It is also possible for two or more sulfonium units in the molecule to be linked together via the radicals $R^1$ to $R^3$. The organic compounds (b) are in general used in amounts of from 1 to 15, preferably from 3 to 10, % by weight, based on the total amount of radiation-sensitive mixture.

Preferred sulfonium salts of the formula (I)

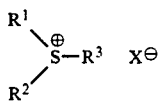
(I)

are those in which $R^1$ and $R^2$ are each methyl and $R^3$ is substituted phenyl with acid-cleavable groups, e.g.

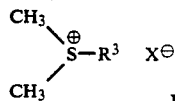

where $R^3$ is for example 4-t-butoxycarbonyloxyphenyl, 4-t-butoxycarbonyloxy-3,5-dimethylphenyl, 4-t-butoxycarbonyloxy-3-methylphenyl, 4-t-butoxycarbonyloxy-2-methylphenyl, 4-t-butoxycarbonyloxy-3,5-dimethoxyphenyl, 4-t-butoxycarbonyloxy-3,5-diphenylphenyl, 1-t-butoxycarbonyloxynaphthyl, 4-trimethylsilyloxyphenyl or 4-trimethylsilyloxynaphthyl, or else those in which two of $R^1$ to $R^3$ form a ring, in particular a five- or six-membered ring, $R^1$ and $R^2$ forming for example tetramethylene groups and $R^3$ being as defined above:

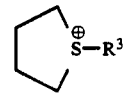

or compounds in which $R^1$ is methyl, $R^2$ is phenyl or tolyl and $R^3$ is substituted phenyl with acid-cleavable groups, such as

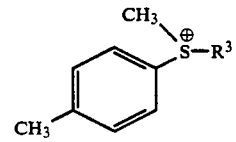

where $R^3$ is 4-t-butoxycarbonyloxyphenyl, 2,4-di-t-butoxycarbonyloxyphenyl, 4-t-butoxycarbonyloxy-2-methoxyphenyl or 4-trimethylsilylphenyl, or where $R^1$ is phenyl, $C_1$-$C_{12}$-alkyl-substituted phenyl or halogen-substituted phenyl and $R^2$ and $R^3$ are each substituted phenyl with acid-cleavable groups, for example

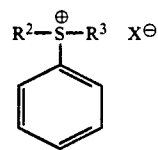

where $R^2$ and $R^3$ are each for example 4-t-butoxycarbonyloxyphenyl, 4-trimethylsilyloxyphenyl, 4-t-butyldimethylsilyloxyphenyl or 4-t-butoxycarbonyloxy-3,5-dimethylphenyl, or $R^1$, $R^2$ and $R^3$ are identical to each other, i.e. sulfonium salts (b) containing three of these radicals with acid-cleavable groups.

Other possibilities are compounds of the formula (I) where one of $R^1$ to $R^3$ is linked to one or more further sulfonium salt radicals, possibly via an acid-cleavable group, these compounds thus likewise containing a plurality of sulfonium groups in the molecule, e.g.

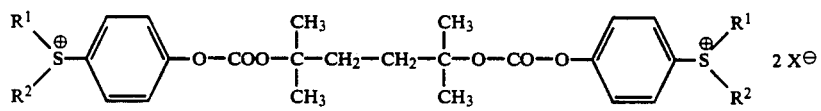

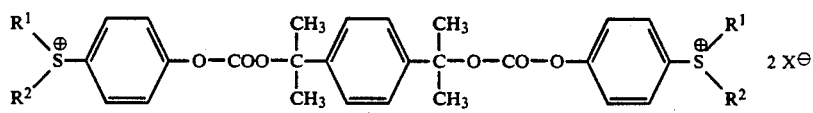

The organic compounds (b) can be prepared by the methods known in organic chemistry for the synthesis of esters, ethers and carbonates by starting from the sulfonium salts with phenolic groups and derivatizing them appropriately. Sulfonium salts with phenolic groups can be reacted with potassium t-butoxide and then with di-t-butyl dicarbonate, to introduce the acid-cleavable group, or alternatively the phenolic sulfonium salt can be reacted with an activated carbonyl compound, e.g. t-butyloxycarbonyl-N-imidazole. Suitable for this purpose are in particular hydroxyphenylsulfonium salts which already contain a non-nucleophilic anion, e.g. hexafluoroantimonate. Such compounds can be prepared for example by the synthesis method of J. Polym. Sci. Chem. Ed. 18 (1980), 1021. For example, the compounds thus prepared can be dissolved in dry tetrahydrofuran, potassium t-butoxide in dry tetrahydrofuran be added, and then a solution of di-t-butyl dicarbonate in tetrahydrofuran be added dropwise. Working up and recrystallizing then gives the pure sulfonium salts with acid-labile groups.

Preferred examples of organic compounds (b) are dimethyl-4-t-butoxycarbonyloxyphenylsulfonium salts with hexafluoroarsenate, hexafluoroantimonate, hexafluorophosphate, hexafluoroborate or trifluoromethanesulfonate as counter-ion, phenylbis(4-t-butoxycarbonyloxyphenyl)sulfonium salts with the counter-ions mentioned, tris(4-t-butoxycarbonyloxyphenyl)sulfonium salts with the counter-ion mentioned or 1-naphthyl-4-trimethylsilyloxytetramethylenesulfonium salts with the counter-ions mentioned.

(c) The organic compounds (c) which react with water or stronger nucleophiles at up to 120° C., if necessary even in the presence of an acid catalyst, are preferably acetals and ketals, such as dialkyl acetals and dialkyl ketals wherein each alkyl moiety may contain from 1 to 12, preferably from 1 to 4, carbon atoms, such as dialkyl acetals of propionaldehyde, butyraldehyde or benzaldehyde, dialkyl ketals of 2-hexanone, acetophenone or cyclohexanone, vinyl and enol ethers, such as isobutyl vinyl ether, dihydropyran, 4-phenyl-2H-3,4-dihydropyran, enol ethers such as

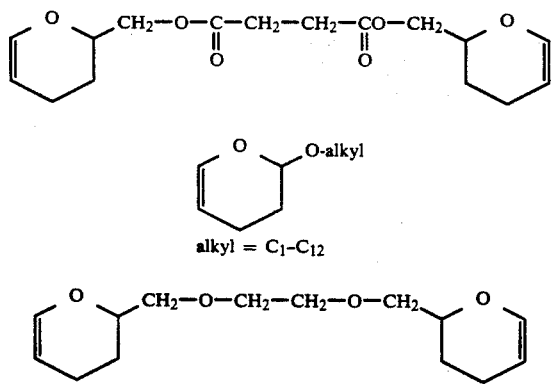

and other vinyl and enol ethers as described in DE-A-23 06 248, orthocarboxylic esters of the formula

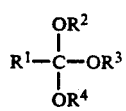

where $R^1$ is hydrogen, substituted or unsubstituted alkyl of from 1 to 12 carbon atoms, substituted or unsubstituted phenyl, or substituted or unsubstituted cycloalkyl of 5 or 6 carbon atoms, and $R^2$ to $R^4$ are identical or different and each is alkyl or alkenyl of from 1 to 12 carbon atoms, cycloalkyl or cycloalkenyl each of 5 or 6 carbon atoms or substituted or unsubstituted aryl, in particular phenyl, such compounds having been described for example in U.S. Pat. No. 4,101,323;

- anhydrides of aliphatic carboxylic acids, e.g. acetic anhydride, propionic anhydride, butyric anhydride or hexanoic anhydride, fluorinated carboxylic anhydrides, such as perfluorobutyric anhydride, malonic anhydride, succinic anhydride, glutaric anhydride or adipic anhydride;
- esters of di- or polycarboxylic acids with alcohols containing from 1 to 4 carbon atoms, such as dimethyl oxalate, diethyl oxalate or dimethyl malonate, cyclic carboxylic esters, such as Meldrum acid or methyl-Meldrum acid, and
- diazo or diazonium compounds which react with light by elimination of nitrogen and liberate reactive intermediates which are capable of reaction with water or other nucleophiles, such as the commercially available o-naphthoquinonediazides, diazo-Meldrum acid and soluble diazonium salts.

In principle, it is possible to use any of these compounds and mixtures thereof as organic compounds (c), but it is particularly preferable to use those compounds which have boiling points > 140° C. and are readily soluble in solvents of medium polarity, such as methoxypropyl acetate, cyclohexanone, ethyl lactate and diacetone alcohol.

The organic compounds (c) are present in the radiation-sensitive mixture of the present invention in an amount of from 0.1 to 10, preferably from 0.5 to 5, % by weight, based on the total amount of components (a)+(b)+(c).

In the novel process for producing relief patterns and relief images, a radiation-sensitive recording layer consisting essentially of a radiation-sensitive mixture of the present invention, advantageously applied dissolved in an inert solvent, e.g. methylpropylene glycol acetate, methylcellosolve acetate or ethylcellosolve acetate, to a suitable substrate, e.g. a silicon wafer, in a film thickness (measured dry) of 0.2 to 4 μm in a conventional manner, for example by spincoating, and dried, is subjected to imagewise irradiation at an energy level such that, following a postbake at from 60° to 120° C. for from 5 seconds to 5 minutes, the solubility of the irradiated areas in aqueous alkali, for example alkaline developers of pH 10–14 based on alkali metal hydroxides, alkali metal silicates or amines, such as tetramethylammonium hydroxide, increases and these irradiated areas can be selectively removed with the alkaline developer.

The mixtures exhibit high sensitivity and contrasts. They produce relief structures of high quality.

Further particulars concerning the composition and further processing of radiation-sensitive mixtures may also be found for example in DE-A-37 21 741.

In the Examples, parts and percentages are by weight, unless otherwise stated.

EXAMPLE 1

A photoresist solution is prepared from 15 parts of tris(4-t-butoxycarbonyloxyphenyl)sulfonium trifluoromethanesulfonate, 5 parts of glutaric anhydride, 80 parts of poly(p-vinylphenol) and 300 parts of methylpropylene glycol acetate. The solution is then filtered through a filter having a pore diameter of 0.2 μm.

This resist solution is applied to an SiO₂ coated silicon wafer by spincoating in a thickness of about 1.0 μm. The wafer is dried at 90° C. for one minute and then brought into contact with an image-bearing test mask

EXAMPLES 4 TO 6

Example 1 is repeated, except that the following exposure and storage times are applied:

| Compound (c) | Exposure time [sec] | Storage time [min] |
| --- | --- | --- |
| (4) 5% of triethyl orthoformate | 3 | 20 |
| (5) 5% of 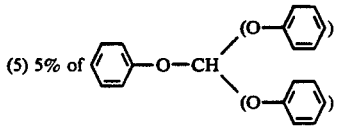 | 4 | 25 |
| (6) 5% of 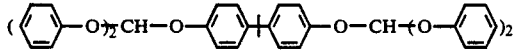 | 3 | 25 | and exposed to excimer laser light of wavelength 248 nm for 3 seconds.

The wafer is then left at 21° C. and 45% relative humidity for 1 hour to simulate any delay periods which might occur between the individual processing steps.

Then the wafer is heated at 90° C. for 1 minute and developed with an alkaline developer. Development to a positive relief pattern is satisfactory, the wafer showing the same characteristics as a comparative wafer which was heated immediately following irradiation.

COMPARATIVE EXAMPLE

Example 1 is repeated, except that the resist solution contains no glutaric anhydride but instead 85% of polymer. Following an hour's storage between irradiation and heating, the resist pattern is no longer developable with the same developer.

EXAMPLE 2

A photoresist solution is prepared from 10 parts of tris(4-t-butoxycarbonyloxyphenyl)sulfonium trifluoromethanesulfonate, 80 parts of poly(p-vinylphenol-co-p-t-butoxycarbonyloxystyrene), 10 parts of adipic anhydride and 300 parts of cyclohexanone. The solution is then filtered through a filter having a pore diameter of 0.2 μm.

This resist solution is applied to a silicon wafer in a film thickness of about 1 μm and baked at 100° C. on a hot plate for 1 minute. It is then subjected to imagewise exposure through a structured test mask by the contact method to excimer laser light of wavelength 248 nm for 4 seconds.

The wafer is left alone for 30 minutes and then baked at 100° C. for 1 minute and developed. It proves developable to a resist pattern of high quality with steep flanks without resist residues.

EXAMPLE 3

Example 1 is repeated, except that glutaric anhydride is replaced by diethyl oxalate. The resist pattern proves to be still satisfactorily developable after a 25 minute delay, while a comparative wafer without the oxalic ester proves to be impossible to develop without leaving a residue after a delay time of only 10 minutes.

Within the stated storage times all the resist patterns are still residuelessly developable following a 1 minute bake at 900° C.

EXAMPLE 7

Example 2 is repeated, except that the adipic anhydride is replaced by the following enol ether

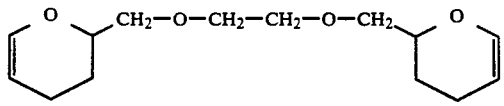

Following 5 seconds' exposure there can be a delay of up to 30 minutes before baking without the development characteristics of the wafer differing from those of wafers baked immediately following exposure.

EXAMPLE 8

A photoresist solution is prepared from 10 parts of dimethyl-4-t-butoxycarbonyloxyphenylsulfonium hexafluoroarsenate, 86 parts of poly(vinylphenol-co-p-t-amyloxycarbonyloxystyrene), 4 parts of diazo-Meldrum acid and 300 parts of ethyl lactate and filtered through a filter having a pore size of 0.2 μm.

The resist solution is applied to a wafer in a film thickness of about 1 μm and subjected to imagewise exposure. The wafer can then be left for 15 minutes without changing the development characteristics, while a comparative wafer, without the diazo-Meldrum acid, will leave residues on the wafer after a delay of only ten minutes.

We claim:

1. A process for producing relief patterns and images, which comprises: applying a radiation-sensitive mixture dissolved in an inert solvent to a substrate in a film thickness (measured dry) of 0.2 to 4 μm, drying the film, subjecting it to imagewise irradiation at an energy level such that, following a postbake at from 60° to 120° C., the solubility of the irradiated areas in an aqueous alkali developer is increased and selectively removing these irradiated areas with the alkali developer, wherein said radiation-sensitive mixture is a composition consisting essentially of (a) a water-insoluble but alkali-soluble polymeric binder,
(b) an organic compound whose solubility in aqueous alkali is increased by the action of an acid and which contains at least one acid-cleavable group and additionally a group which forms a strong acid on irradiation, and
(c) a storage stability improving amount of at least one organic compound which reacts with water or stronger nucleophiles at up to 120° C., even in the presence of an acid catalyst.

2. A process as defined in claim 1, wherein component (a) is present in an amount of from 70 to 96% by weight, component (b) is present in an amount of from 3 to 10% by weight and component (c) is present in an amount of from 0.5 to 5% by weight, each amount being based on the total weight of the three components.

3. A process as defined in claim 1, wherein the organic compound (b) is a sulfonium salt of the formula (I)

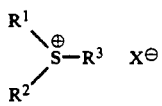

where $R^1$, $R^2$ and $R^3$ are identical or different and each is an aliphatic or aromatic radical which may contain hetero atoms or two of $R^1$ to $R^3$ form a ring, with the proviso that at least one of $R^1$ to $R^3$ contains at least one acid-cleavable group, while one of $R^1$ to $R^3$ can be linked to one or more further sulfonium salt radicals, where appropriate via an acid-cleavable group, and $X^\ominus$ is a non-nucleophilic counter-ion.

4. A process as defined in claim 1, wherein the organic compound (c) is an acetal or ketal.

5. A process as defined in claim 1, wherein the organic compound (c) is a vinyl or enol ether.

6. A process as defined in claim 1, wherein the organic compound (c) is an orthocarboxylic ester.

7. A process as defined in claim 1, wherein the organic compound (c) is a carboxylic anhydride.

8. A process as defined in claim 1, wherein the organic compound (c) is an ester of a di- or polycarboxylic acid with an alcohol containing from 1 to 4 carbon atoms.

9. A process as defined in claim 1, wherein the organic compound (c) is a diazo or diazonium compound.

10. A process as defined in claim 1, wherein the organic compound (c) is a mixture of at least two of the organic compounds (c) mentioned in claims 3 to 8.

11. A process as defined in claim 1, wherein the organic compound (c) is present in an amount of from 0.1 to 10% by weight, based on the total amount of the radiation-sensitive mixture (a)+(b)+(c).

* * * * *